United States Patent [19]

Oguey et al.

[11] 3,950,936
[45] Apr. 20, 1976

[54] DEVICE FOR PROVIDING AN ELECTRO-OPTICAL DISPLAY OF TIME

[75] Inventors: Henri J. Oguey, Peseux; Eric Andre Vittoz, Cernier, both of Switzerland

[73] Assignee: Centre Electronique Horloger S.A., Switzerland

[22] Filed: Nov. 11, 1974

[21] Appl. No.: 522,947

Related U.S. Application Data

[63] Continuation of Ser. No. 339,375, March 8, 1973, abandoned.

[30] Foreign Application Priority Data

Mar. 8, 1972 Switzerland.................... 3382/72

[52] U.S. Cl............................ 58/23 R; 340/324 R
[51] Int. Cl.²........................................ G04C 3/00
[58] Field of Search .................... 58/23 R, 50 R; 340/324 R; 350/160 R

[56] References Cited
UNITED STATES PATENTS

| | | | |
|---|---|---|---|
| 3,626,410 | 12/1971 | deKoster | 58/23 R X |
| 3,707,071 | 12/1972 | Walton | 58/50 R |
| 3,765,163 | 10/1973 | Levine et al. | 58/50 R |

Primary Examiner—Ulysses Weldon
Attorney, Agent, or Firm—Stevens, Davis, Miller & Mosher

[57] ABSTRACT

A device for providing an electro-optical display of time comprises an electronic timekeeper fed by a voltage source and including a time base and a frequency divider. An electro-optical display is formed of groups of electro-chromic cells each able to take two different visual aspects. The cells are controlled by a code converter supplying state variables corresponding to the desired aspects of the cells to provide a display of time. One aspect of the cells corresponds to a stable state, the other aspect to a quasi-stable state which in order to be maintained, requires very low or zero power. Transition of a cell from one state to another requires precisely determined amounts of energy. A change detector supplies to a selector, data to actuate the operations of inscription and erasure of the display cells. The selector dispenses the required amounts of energy supplied to the display to ensure correspondence between the state variables delivered by the code converter and the aspect of the corresponding display cells, in a manner ensuring transition from one state to another with a minimum supply of energy.

15 Claims, 21 Drawing Figures

H: 1 2 3 4 5 6 7 8 9 10 11 12

D: 0 1 2 3 4 5

M: 0 1 2 3 4 5 6 7 8 9

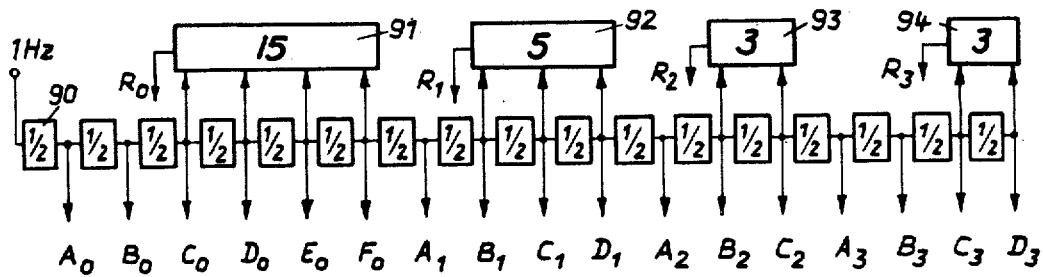
Fig. 7
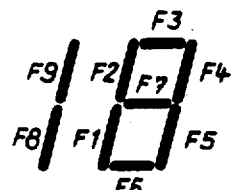
Fig. 8
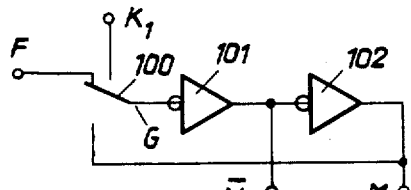
Fig. 10
Fig. 9

DEVICE FOR PROVIDING AN ELECTRO-OPTICAL DISPLAY OF TIME

This is a continuation, of application Ser. No. 339,375, filed Mar. 8, 1973 now abandoned.

The invention relates to devices for providing an electro-optical display of time.

Various timekeepers with different types of electro-optical displays, such as incandescent lamps, gas discharge, electroluminescence, liquid crystals and so on, are already known. All of the types proposed to date involve difficulties in their application to wrist-watches, because of the low voltage and the low power storage capacity of the available sources of energy, which are generally formed by a mercury or silver oxide cell or battery having a capacity of from 100 to 200 mAh and supplying a voltage of from 1.35 to 1.5 V. To ensure a useful life of one year for such a battery, the mean current consumption for the entire watch must be from 10 to 20 $\mu A$.

A still relatively little known possibility of providing a display for a watch consists of influencing the light absorbtion or reflection properties of a material by a reversible electrochemical transformation. The application of "electrochromic" materials can be included in this category, the term electrochromic being used herein to designate various displays with the property of having at least two states having different light reflection or absorption properties. One of these states, termed the clear state, is stable for an indefinite period. The other state, termed the dark state, is quasi-stable, i.e. to be maintained it requires a very small or zero expenditure of energy. The transition from one state to another is possible under the effect of an electrical energization (excitation) and requires a non-negligeable expenditure of energy. Return to the original state may take place without an expenditure of energy or, to the contrary, may require a supplementary supply of energy in order to be accelerated. The mean power $\overline{P}$ required to produce the periodic appearance and disappearance of any sign whatsoever at a frequency f can be summarized by the formula:

$$P = P_s + fW_t.  \quad (1)$$

where $P_s$ is the mean static power required to maintain one of the states, and $W_t$ is the energy required for the transition from one of the states to the other and return to the initial state. The electrochromic materials to which the invention applies all have the property that in expression (1) the second term ($fW_t$) is greater than the first ($P_s$) even at very low frequencies well less than 1 Hz. Moreover the order of magnitude of this term ($fW_t$) is such that to obtain a low comsumption it is essential to exactly dose the quantity of energy supplied for each transition as a function of the optical effect sought. This problem is basically different from those met with other types of display, both of the active type (i.e. displays which act as light sources, such as lamps, electro-luminescent elements and so on) and of the passive type (displays based on the properties of certain bodies to change aspect by the application of an electrical field), for which the power consumed is related to the number or to the surface area of the excited signs. Hence, the known circuits for these other types are unsuitable for the energization of electrochromic materials, since the energy that they use would be far too great.

The invention accordingly applies to a device for providing an electro-optical display of time comprising an electronic timekeeper fed by a voltage source and including a time base and a frequency divider, and an electro-optical display formed of cells containing electrochromic materials able to take two different visual aspects, the cells controlled by a code converter having outputs supplying state variables each defining the aspect that a display cell must have, one of the aspects of a cell corresponding to a stable state, the other aspect of a cell corresponding to a quasi stable state which requires at most a very low power to be maintained, and transition of a cell from one state to the other requiring precisely determined amounts of energy. According to the invention, a change detector supplies to a selector control signals to actuate the operations of inscription and erasure of the display cells, the selector dispensing the required amounts of energy to each cell to ensure correspondence between the visual aspect of each cell and the state variables delivered by the code converter in a manner to minimize the mean energy consumption.

The accompanying drawings show, but way of example, an embodiment of a device according to the invention including a timekeeper and an electrochromatic display, as well as variants of details. In the drawings:

FIG. 7 is a block diagram of the frequency divider of FIG. 5;

FIG. 8 shows the numeration of the segments of a displayed number;

FIG. 9 is a diagram showing the correspondence between the displayed numbers, the divider output variables and the state variables associated with each segment;

FIG. 10 is a schematic diagram of a memory cell;

Figure 1:
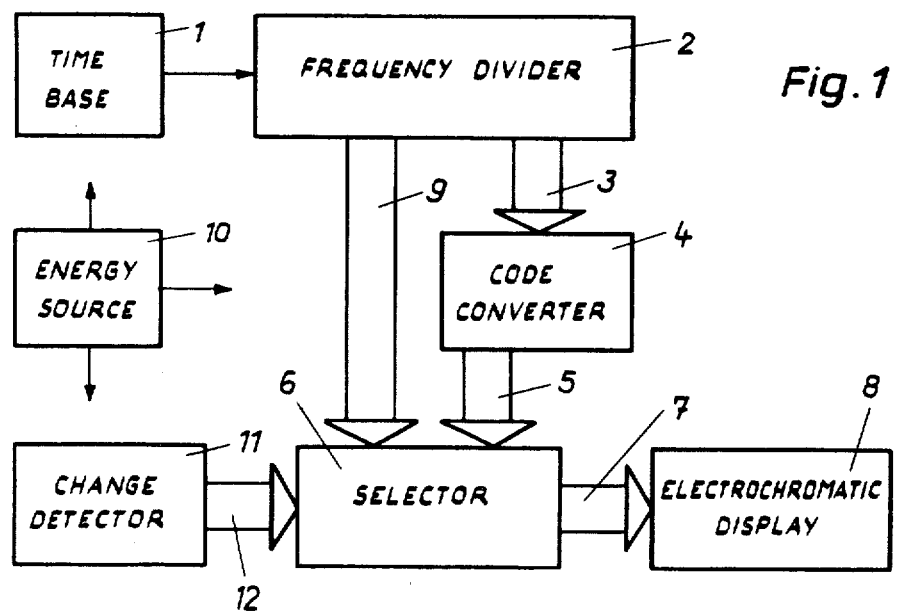
FIG. 1 is an overall schematic diagram illustrating the principle of operation of the device.

FIG. 1 is a block diagram of a watch with an electrochromic display, and illustrates the principle of control of such a display. The watch comprises a time base 1 of a known type, for example an oscillator controlled by a quartz crystal, by a metallic resonator, by an RC circuit or by a radio set. Time base 1 may include a first frequency divider so as to provide an output signal of 1 Hz for example. The output signal of time base 1 is supplied to a frequency divider 2 of a known type, preferably including a certain number of binary stages in cascade. Some of the outputs of divider 2, from intermediary stages, and which are schematically represented by arrow 3, are connected to a code converter 4 which provides a logical combination of the signals it receives. Converter 4 has several outputs 5 which supply signals designated by the term "state variables" since every one represents the state which a display element must have at any instant. These state variables are logical variables able to take only the value "0" or "1", represented in a physical system usually by two different voltage levels. These variables are fed to a selector 6 including amplifiers whose outputs 7 are connected to the electrodes of a display device 8. In certain known systems, selector 6 is controlled by outputs 9 of the divider 2, which outputs 9 are in general different from the outputs 3 leading to converter 4. The selector 6 can perform different functions according to the system, for example a modulation of the duration of the signals which permits an adjustment of the brightness (intensity), or a matrix function which enables a reduction of the number of connections to the display member. A battery 10 supplies energy to all of the energy-consuming members, e.g. the time-base, the divider and the display. A system with the above-described components is insufficient for the control of an electrochromic display device, since such a device requires the supply of a precisely-defined amount of energy to change each elementary sign from one state to the other, followed by a very low or zero energization power to maintain this state until the next change. The invention proposes to detect changes of the state variables by a change detector 11 which, via connections 12, supplies supplementary data which enable the selector 6 to form the required pulses for a correct energization of the display. The detector 11 may, in certain embodiments, be combined with the selector 6 in a single circuit. Before describing in fuller detail the control members for an electrochromic display, such a display and its properties will be briefly described.

Figure 2:
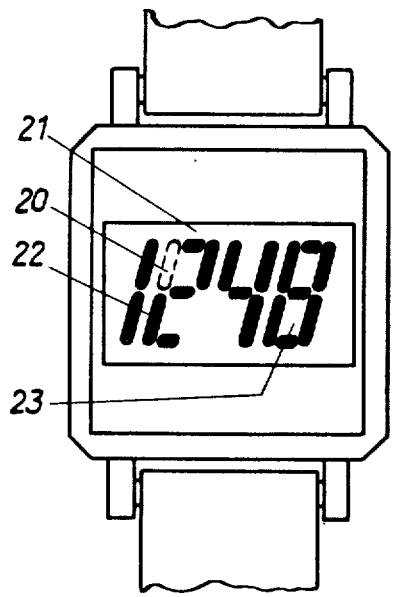
FIG. 2 is a face view of the digital hours and minutes time display of a wrist watch in which the device is embodied.

A watch with a digital display of the hours and minutes is shown in FIG. 2. The elementary display cells are segments able to adopt two different aspects according to the energization. A segment such as 20 in one state is hardly visible, since its color blends with that of a background 21. A segment such as 22 in another state is clearly visible since it has a contrasting color or tint. The passage from one state to another is gradual, but for the requirements of this digital display only two different states are needed; these states will for the purposes of simplification be designated by the terms clear state and dark state. The segments are disposed in a known manner in groups which, apart from a first group of two segments forming a figure one, are each in the configuration of a figure eight (23), visible when all of the segments of the group are dark. By different combinations of the clear and dark segments of each group, it is thus possible to represent all of the numbers 0 to 9 as well as certain letters. Each number thus formed (except 1) may typically be 7 mm × 3 mm, the width of the lines being from 0.3 to 0.6 mm. The energization of selected segments by electric means enables a digital display of the time, in hours and minutes, from 1h 00 min. to 12h 59 min. The representation of 0h is unusual and can be avoided. The display can be extended to 24h without difficulty.

Figure 3:
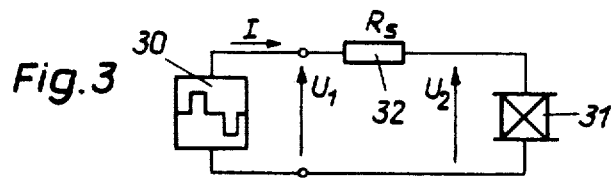
FIG. 3 is a diagram of an energization circuit for a single display cell.

FIG. 3 shows a simple energization circuit for electrochromic display. A voltage generator 30 supplies bipolar pulses to a schematically shown display cell (segment) 31 via a resistor $R_s$ 32 in series. The voltage across generator 30 is designated to $U_1$, and that across the display cell 31 by $U_2$. I designates the current supplied.

Figure 4:
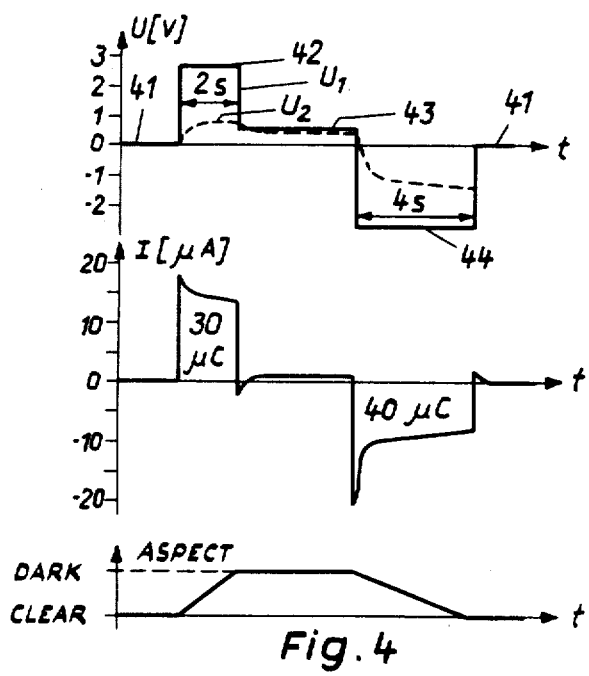
FIG. 4 are graphs showing voltages, current and aspect, illustrating the energization of an electrochromic display cell.

FIG. 4 shows the results of typical measurements made on the circuit of FIG. 3. Generator 30 supplies a voltage $U_1$ which takes successively different levels. A current I passes through $R_s$ and causes a transformation of the display cell 31 accompanied by a change of aspect and an electric voltage $U_2$. Four phases determined by the voltage pulses of the generator 30 can be distinguished:

1. A rest phase 41 in which the cell 31 is in the clear state, for an indeterminate time i.e., the clear state is present as long as no external action causes a change of state to the dark state; during this phase, the voltages and currents are zero, and the cell is preferably short-circuited, but may also be open-circuited.

2. An inscription phase 42 produced by the application of a positive voltage from generator 30, with an accompanying current. The display cell 31 passes gradually from the clear state to the dark state, and the voltage $U_2$ across cell 31 rises. After several seconds (e.g. 2 s., as indicated) the final dark aspect is reached. The integral of the current represents the charge Q supplied to the cell 31 (e.g. 30$\mu$C, as indicated).

3. A maintenance phase 43 for which the conditions are such that the aspect of cell 31 remains substantially constant. In certain cases, as in the shown example, a low maintenance current is necessary, and is obtained by applying a voltage $U_1$ slightly greater than the voltage $U_2$ corresponding to the desired state of the display. This current compensates for a leakage current of the cell 31. If the leakage current is negligeable, it suffices to leave the cell 31 during this phase in open circuit to avoid a discharge current to the exterior.

4. An erasure phase 44 produced by the application of a voltage $U_1$ of opposite sign, which supplies a current in the opposite direction. The aspect of the cell passes from dark to clear. This phase is generally slower than the inscription phase (e.g. taking 4 s., as indicated) and requires a greater charge (e.g. 40 $\mu$C, as indicated). However, an economy of energy is possible by starting the erasure phase by a period with the cell 31 short-circuited, and terminating the cycle by the application of a negative voltage.

The general considerations involved in use of a display cell having been described with reference to FIGS. 3 and 4, the circuits of a watch having an electrochromic display will now be described.

Figure 5:
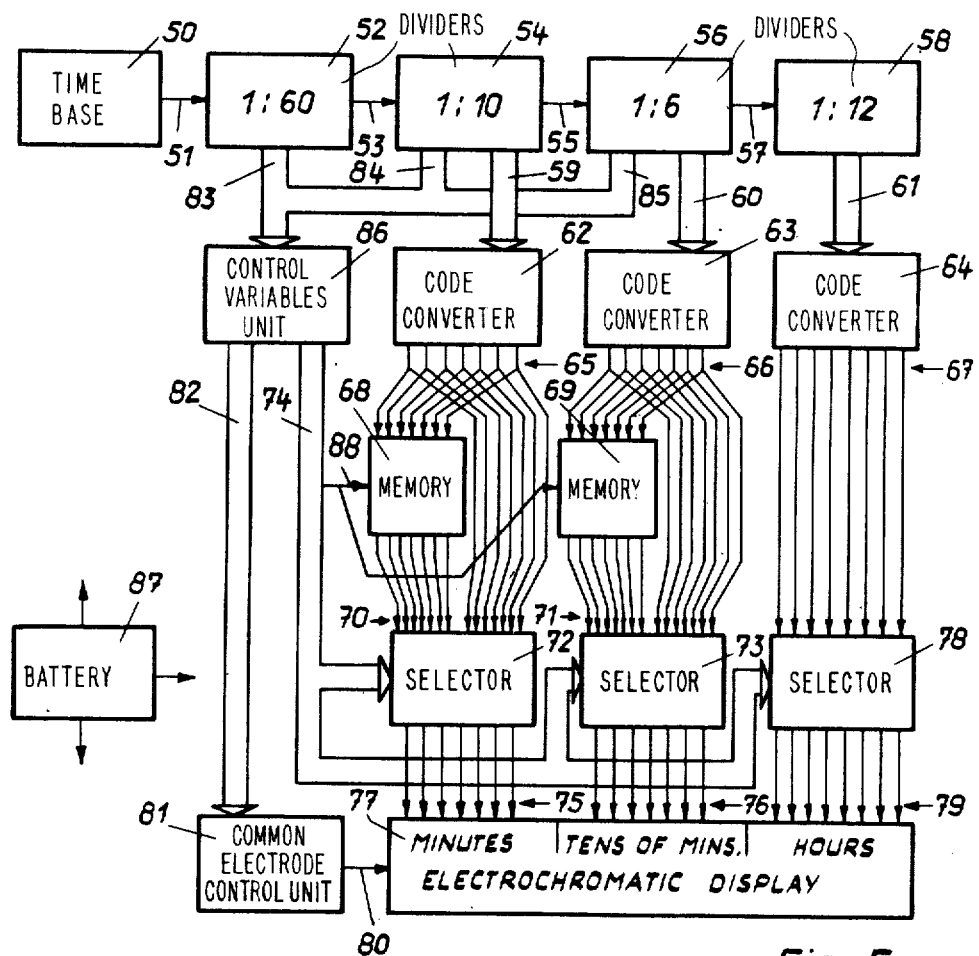
FIG. 5 is a more detailed block diagram of the device.

FIG. 5 is a block diagram of a timekeeper having a digital display of the units and tens of minutes, and of the hours. A time base 50 combined with a first frequency divider delivers 1 Hz output pulses 51. A divider 52, dividing by 60, divides pulses 51 to provide a signal 53 the period of which is 1 minute. A divider 54, dividing by 10, divides signal 53 to provide a signal 55 having a period of 10 minutes. A divider 56, dividing by six, divides signal 55 to provide a signal 57 having a period of one hour. Finally, signal 57 is fed to a divider 58 which divides by twelve. Dividers 54, 56 and 58 each have several outputs, represented by arrows 59, 60 and 61 respectively, and which are connected to code converters 62, 63 and 64 whose outputs are the state variables 65, 66 and 67 respectively. Each state variable is associated with a display segment, and represents the state which the segment must have.

The structure and operation of the device is different for the variables which frequently change state, such as the units and tens of minutes, and for the variables which change state relatively rarely, such as the hours.

For variables which frequently change state, it is essential to limit the current consumption by reducing the inscription and erasure operations to a minimum, since each such operation consumes a relatively large electrical charge. In conformity with the conditions of energization of a display cell, as set out with reference to FIG. 4, the device must detect changes of the state variables and, for each type of change, apply the appropriate electrical energization to the corresponding display cell. Detection of the changes and the control of each cell takes place by means of units M and S. The M units 68 and 69 are memory elements which memorize the state variables 65 and 66 before the changes and restitute this data after the changes, by outputs 70 and 71. A control variable 88 determines the phase of writing and reading of memories 68, 69. The function of the selector units S 72 and 73 is to combine the state variables 65 and 66, the memorized variables 70 and 71, and the control variables 74 whose function is to actuate the various phases of inscription, maintenance, erasure or rest. These units S also comprise amplifiers capable of delivering the required voltages and currents to the display. The outputs 75 and 76 of these units are directly connected to individual electrodes of the electrochromic display 77, i.e. to one electrode per segment.

A simplified arrangement is adequate for the variables which change state relatively rarely, since it is acceptable to carry out superfluous erasure and inscription operations. During a change of the hour displayed, all of the dark segments are erased just before the change of hour and all of the dark segments of the new value displayed are inscribed just after the change of hour. This simplified arrangement renders the memory function superfluous. One change detector is common to all of the segments for display of the hours, and is controlled by a combination of the outputs of the divider, having a period of 1 hour, independent of the information to be displayed, i.e. of the state variables. The state variables 67 corresponding to the hours display are fed into a selector 78 where they are combined with the control variables 74 so as to excite the display 77 by the electrodes 79.

Each segment of the display comprises two electrodes. One of these electrodes is individual and is connected to a respective output of the groups of outputs 75, 76 and 79. The other electrode 80 is common and may be connected to ground; in some instances it is however advantageous to control the electrode 80 by a control unit CEC 81 for the common electrode. This enables, by the addition of a single auxiliary circuit, a simplification of the control of all of the other individual electrodes. It also enables the use of only a single voltage source to supply the entire system. This unit 81 is controlled by its own control variables 82. The control variables 74 and 82 are obtained by logical combinations of the intermediary outputs 83, 84 and 85 of the divider, which combinations are carried out in the control variable unit VC 86. The entire device is supplied by at least one battery or cell 87.

Figure 6:
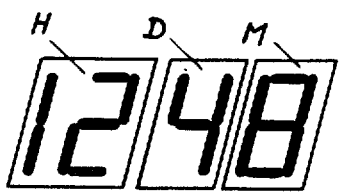
FIG. 6 illustrates a mode of digital representation of the hours and minutes.

Before treating in detail the functions relative to the timekeeper of FIG. 5, the requirements for a digital display must be further specified. FIG. 6 shows a typical time reading. Although four different digits are involved, it is advantageous to group the 2 hours digits and to consider them as a single symbol H which can successively have twelve different aspects, shown in the first line. The tens of minutes digit D can have six different aspects shown in the second line, and the minutes digit M ten different aspects shown in the third line.

Table I summarizes several properties of the digital display of the hours, and tens and units of minutes in which the displayed numbers (except for the initial 1) are formed by the selective energization of seven-segment figures. The number of different aspects of each symbol is deduced from FIG. 6, as is the total number of dark segments per cycle, by adding the number of visible segments in each line of the figure.

The mean number of dark segments per displayed symbol is obtained by dividing the total number of dark segments by the number of aspects. The duration of the cycle is the interval of time which separates the successive appearance of the same symbol. Considering FIG. 6 once more, it is observed that the transition of one symbol to the next involves, for each segment, four possibilities:

1. maintenance of the clear state;
2. passage from clear to dark (inscription);
3. maintenance of the dark state; and
4. passage from dark to clear (erasure).

Since it is an essential property of electrochromic display that the energy consumption is related to the changes of state, it is important to know the number of inscriptions for a complete cycle. This number of inscriptions, divided by the number of aspects of a symbol, gives the mean number of inscriptions per aspect and, divided by the duration of the cycle in minutes, gives the mean number of inscriptions per minute. Formula (2), at the bottom of Table I, indicates the means current consumption for the electrochromic display as a function of the mean current $I_o$ required to maintain a single segment in the dark state ($I_o$ can be zero in certain cases) and as a function of the charges $Q_1$ and $Q_2$ required respectively for the inscription and erasure of a single segment. The number $N_i$ of inscriptions during one cycle is equal to the number of erasures. The factor 60 indicates that the duration of the reference cycle is 60 seconds (frequency $f = (1/60)$ Hz). This formula (2) is a special case of formula (1).

A first manner of energizing the electrochromic display consists of erasing all of the segments at the end of each minute and inscribing the required new segments at the beginning of the following minute. The mean number of inscriptions $N_i$ will thus correspond to the mean number of dark segments $N_s$, namely $$N_{ii} = 14.57$$

Table I
Properties of a Digital Display of Hours and Minutes including Seven-Segment Digits

| Symbol | Hours | Tens of Minutes | Minutes |
|---|---|---|---|
| Number of different aspects | 12 | 6 | 10 |
| Total number of segments | 62 | 27 | 49 |
| Mean number of dark segments | 5.17 | 4.50 | 4.90 |
| Duration of the cycle | 12h | 1h | 10 min. |
| Number of inscriptions per cycle | 22(62) | 10 | 15 |
| Mean number of inscriptions | 1.83(5.17) | 1.67 | 1.5 |
| Number of inscriptions per minute | 0.03(0.09) | 0.17 | 1.5 |

Overall mean number of dark segments
$$N_s = 5.17 + 4.50 + 4.90 = 14.57$$

Total number of inscriptions per minute
(a) minimum  $N_i = 0.03 + 0.17 + 1.5 = 1.70$
(b) with total erasure of the displayed hours upon each change
$$N_i = 0.09 + 0.17 + 1.5 = 1.76$$

Mean current consumption for the electrochromic display
$$\bar{I} = N_s I_o + N_i (Q_i + Q_r) / 60 \qquad (2)$$

A second manner of energizing the electrochromic display consists of totally erasing a symbol at the end of the cycle during which it has not changed, and inscribing the new symbol at the beginning of the following cycle. This amounts to inscribing a mean of 4.9 segments per minute, plus 4.5 segments every ten minutes, plus 5.17 segments every sixty minutes. The mean number of inscriptions per minute will thus be $$N_{i2} = 4.9 + (4.5/10) + (5.17/60) = 5.44$$

A third manner of energizing the electrochromic display consists of carrying out an operation only when there is a change in the displayed symbol, as in the second process, but by inscribing all of the segments at the end of the cycle and then erasing certain at the beginning of the following cycle. This involves inscribing and erasing a lesser mean number of segments than for the second manner, this number being, for a 7-segment display, the complement to 7 and, for the 9-segment hour display, the complement to 9 of the mean number of dark segments. A display of time by this process involves inscribing a mean of 2.1 segments each minute, plus 2.5 segments each ten minutes, plus 1.83 segments each 60 minutes. The mean number of inscriptions per minute will thus be $$N_{i3} = 2.1 + (2.5/10) + 1.83/60 = 2.38$$

A fourth manner of energizing the electrochromic display consists of only carrying out inscription and erasure operations on the segments which require to be changed. By systematically proceeding in this manner for all of the displayed symbols, we obtain the minimum number as calculated in Table I, namely
$$N_{i4} = 1.70$$

For each digit, it is possible to choose any one of these four types of excitation, so that it is possible employ either the same process or different processes for different digits. Table I indicates, for example, the solution consisting of exciting the symbols of the units and tens of minutes according to the fourth process, which involves a minimum number of changes, while the symbols of hours are excited by the second process, i.e. being completely erased and a new combination of segments inscribed once per hour. For the total display, we thus arrive at a mean number of inscriptions $$N_{i5} = 1.76$$

The choice of process will depend on considerations involving the properties of the display, the acceptable limiting consumption, and the complexity of the circuits.

By way of numerical examples, an electrochromic display whose characteristics correspond to those shown in FIG. 4 requires a charge of 70 $\mu$C per segment and per change. If, in addition, this display requires a mean maintenance current $I_o$ of 0.1 $\mu$A per segment, the five energization processes gives the mean consumptions shown in Table II.

Table II

| | Mean Consumption According to Energization Process | | | | |
|---|---|---|---|---|---|
| Energization Process | 1 | 2 | 3 | 4 | 5 |
| Mean number of inscriptions $N_{i...}$ | 14.57 | 5.44 | 2.38 | 1.70 | 1.76 |
| Static consumption in $\mu$A | 1.46 | 1.46 | 1.46 | 1.46 | 1.46 |
| Dynamic consumption in $\mu$A | 17.0 | 6.35 | 2.78 | 1.99 | 2.06 |
| Total consumption in $\mu$A | 18.5 | 7.81 | 4.24 | 3.45 | 3.52 |

In a wrist watch where the current available for the display must not exceed 4$\mu$A, only processes 4 and 5 can be used. Process 5 has been chosen as example (FIG. 5), since it involves a hybrid arrangement relying on process No. 2 for the hours and process No. 4 for the units and tens of minutes.

The following description, with reference to FIGS. 7 to 14, gives details of the circuits of the system shown in the block diagram of FIG. 5.

FIG. 7 shows the frequency divider which delivers, from a reference frequency of 1 Hz, a series of signals corresponding to intermediary outputs $A_o$, $B_o$ . . . $D_3$. This divider includes binary stages or flip-flops such as 90 of a known type connected in cascade, each stage having a divider input, a reset input and an output. The output signal changes each time that the divider input signal passes from 1 to 0. The output signal is set to zero each time that the reset input is 1. The divider also includes logic units 91 to 94 which combine certain outputs of the binary stages and deliver zero-setting signals $R_o$ to $R_3$ when certain combinations of the intermediary outputs are reached. The decimal numbers corresponding to these combinations are indicated on the respective units. The desired periods for the output signals are thus obtained. For example, at $F_o$ a signal with a period of 1 minute is required. The first six binary stages of the divider would normally divide by 64. Of the six available intermediary outputs $A_o$, $B_o$, $C_o$, $D_o$, $E_o$, $F_o$, four ($C_o$, $D_o$, $E_o$ and $F_o$) are connected to the logic unit 91 which "recognizes" the binary combination corresponding to the decimal number 15, and sets the last four stages to zero at that moment. The division ratio of the combination of these four stages and of the logic unit 91 is thus reduced from 16 and 15, and the six stages divide by sixty. In an analogous manner, the following group of four binary stages, which supply four intermediary outputs $A_1$, $B_1$, $C_1$, $D_1$ divide by ten by means of a connection of the outputs $B_1$, $C_1$ and $D_1$ to a logic unit 92 which recognizes the binary combination corresponding to the decimal number 5 and sets the corresponding stages to zero. The following group of three binary stages, which supply three intermediate outputs $A_2$, $B_2$, $C_2$, divides by six by means of a connection of the outputs $B_2$ and $C_2$ to a logic unit 93 which recognizes the binary combination corresponding to the decimal number 3 and sets the corresponding stages to zero. Finally, the last group of 4 binary stages, which supply the four intermediate outputs $A_3$, $B_3$, $C_3$, $D_3$, divides by twelve by means of a connection of the outputs $C_3$, $D_3$ to a logic unit 94 which recognizes the binary combination corresponding to the decimal number 3 and sets the corresponding stages to zero. The divider thus supplies at $F_0$ a signal with a period of one minute, at $D_1$ a signal with a period of ten minutes, at $C_2$ a signal with a period of 1 hour, and at $D_3$ a signal with a period of 12 hours.

The code converter units CC 62, 63 and 64 of FIG. 5 are formed by combinations of logical gates which directly form, from the divider outputs 59, 60 and 61, the state variables F 65, 66 and 67 which represent the logical state that each segment of the display must have. FIG. 8 defines the correspondence between the segments of the display and the state variables F. FIG. 9 shows, as a function of each number to be displayed, the state of the outputs of the divider ABCD (a horizontal line representing the logical value 1 and a blank the logical value "0") end the state variables F. The logical equations showing the correlation between the variables ABCD and the variables F are obtained by known logical processes, for example reduction by means of Karnaugh's Tables. These equations are shown in Table III.

able $K_1$ determines the position of the electronic switch 100 so that when $K_1 = 1$, $G = F$ and $K_1 = 0$, $G = M$. In the position $K_1 = 1$, the variable F sets the state of the two inverters so that $F = M$. In the position $K_1 = 0$, the two inverters are looped and form a bistable system, i.e. a storage element which indefinitely holds the value that F had at the moment of passage from $K_1 = 0$ to $K_1 = 1$.

Figure 11:
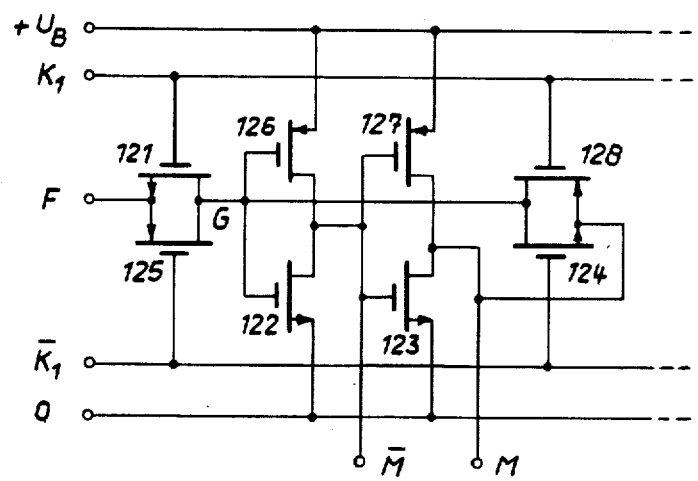
FIG. 11 is a circuit diagram of a memory cell including complementary MOS transistors.

No mention has yet been made of the technology to be employed to effect the preceding functions. The techniques of integrated circuits with complementary metal-oxide-semiconductor transistors (MOST) are well adapted to the conditions involved in electronic wrist-watches, and will serve to illustrate the realization of several particular functions. A memory cell according to the diagram of FIG. 10, comprising eight MOST, is shown in FIG. 11. Four of these transistors, 121, 122, 123 and 124, are n-channel and the other four transistors, 125, 126, 127 and 128 are p-channel. Transistors 122 and 126 form the first inverter and transistors 123 and 127 the second inverter. The electronic switch has two transmission gates. One transmission gate is composed of one n-type MOST 121 and on p-type MOST 125 whose sources, connected together, form the input, whose drains, also connected together, form the output, and whose gates are respectively connected to a control variable $K_1$ and its complement $\overline{K}_1$. This first transmission gate connects the input variable F to the input G of the first inverter when the control variable $K_1 = 1$ and its complement $\overline{K}_1 = 0$. The second transmission gate, formed of MOST 124 and 128, connects the output M of the second inverter to the input G when $K_1 = 0$ and $\overline{K}_1 = 1$. This circuit thus delivers the variable M and its complement M in a manner satisfying the conditions layed down.

Figure 12:
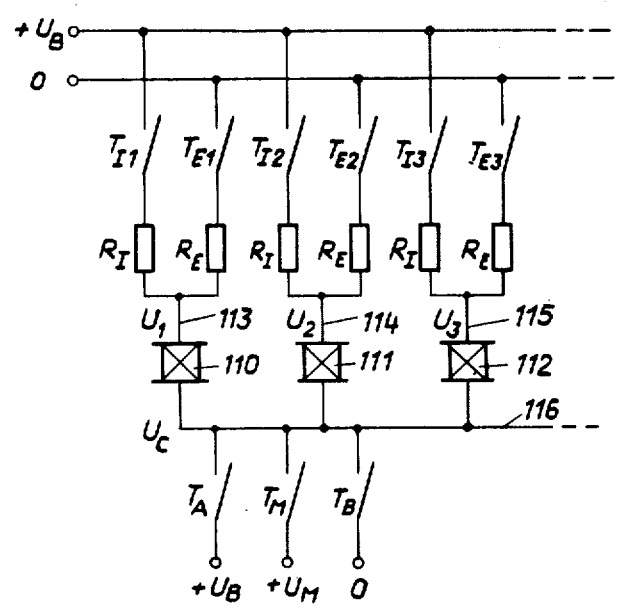
FIG. 12 is a schematic diagram of the energization circuits of the electrochromic display.

The units S, VC and CEC of FIG. 5 are determined according to the conditions of energization of the display cells. It is thus convenient to specify the energization means before describing the other functional units. FIG. 12 shows three display cells 110, 111, 112 having respective individual control electrodes 113, 114, 115

Table III

Formation of the Variables F in the Code Converters as a Function of the Divider Output Variables

| Display | 1. Minutes (Units) | 2. Tens of Minutes | 3. Hours |
|---|---|---|---|
| Count | 0-1-2-...-8-9 | 0-1-2-3-4-5 | 12-1-2-3-...-10-11 |
| Divider Var. | $A_1$, $B_1$, $C_1$, $D_1$ | $A_2$, $B_2$, $C_2$ | $A_3$, $B_3$, $C_3$, $D_3$ |
| State Var. | $F_{m1}$ to $F_{m7}$ | $F_{m11}$ to $F_{m17}$ | $F_{h1}$ to $F_{h8}$ |
| $F_1$ | $\overline{BCD} + \overline{A}B + \overline{A}C$ | $\overline{BC} + \overline{A}B$ | $\overline{A}B+\overline{BCD}+BD+\overline{A}D$ |
| $F_2$ | $\overline{B} + \overline{A}C$ | B | $D + \overline{A}C + A\overline{B}$ |
| $F_3$ | $B + D + \overline{AC} + AC$ | $B + \overline{AC} + AC$ | $ABD+AC\overline{B}+\overline{B}D+\overline{AC}+AB$ |
| $F_4$ | $D+AB+\overline{A}\overline{B}+\overline{AC}$ | $B + \overline{A}$ | $BD+\overline{A}\overline{B}+\overline{AC}+AB\overline{D}$ |
| $F_5$ | $C+D+AB+A\overline{B}$ | $C+AB+\overline{A}\overline{B}$ | $C+\overline{B}D+\overline{A}D+AB\overline{D}$ |
| $F_6$ | $D+\overline{AC}+\overline{A}B+B\overline{C}+A\overline{B}C$ | $B+\overline{AC}+AC=F_3$ | $\overline{B}D+\overline{AC}+A\overline{B}-+A\overline{BC}+B\overline{CD}$ |
| $F_7$ | $D+B\overline{C}+\overline{A}B+\overline{B}C$ | $B + C$ | $A\overline{BC}+\overline{B}D+\overline{AC}-+\overline{AB}+B\overline{CD}$ |
| $F_8 = F_9$ | | | $BD + \overline{ABCD}$ |

The memories 68 and 69 of FIG. 5 can be provided by means of a circuit including two inverters and an electronic switch. FIG. 10 is a schematic diagram of a memory cell. A state variable F is introduced, via a switch 100, to the input of an inverter 101 whose output is (a) connected to the input of a second inverter 102 and (b) delivers variable M. The output of the second inverter 102 is connected to the other terminal of switch 100 and delivers variable M. A control variand a common electrode 116. A first means of controlling each cell would be to connect the common electrode to ground and to connect each individual electrode, via series resistors and switches, to one or more sources of positive voltage and to one source of negative voltage. The advantage of such an arrangement would be the possibility of simultaneously controlling the inscription of certain cells and the erasure of others. FIG. 12 shows another arrangement the main advantage of which is that a single source of voltage $+U_B$ is used for the inscription and erasure operations. An auxiliary source of voltage $+U_M$ is required only if a maintenance or holding voltage is necessary. However, such a source of voltage $+U_M$ supplies a very low current and can be obtained from $+U_B$ by means of a voltage regulator, since $U_M$ is comprised between 0 and $U_B$. The arrangement shown shows that each individual electrode such as 113 is energized for inscription by means of a first switch such as $T_{I1}$, in series with a resistor $R_I$, connected to a positive terminal of the source of voltage $+U_B$, and for erasure by means of a second switch such as $T_{E1}$, in series with a resistor $R_E$, connected to ground (0). The common electrode is connected to three switches $T_A$, $T_M$ and $T_B$ which respectively connect it to $+U_B$, to $+U_M$ or to ground (0).

Each cell can be subjected to one of five different conditions corresponding to combinations and which the switches can be open or closed. A transfer variable T associated with each switch is 0 when the switch is opened and 1 when it is closed, and Table IV shows the five conditions in question. In the third column ($U_1 - U_C$), the voltage across the terminals of the cell is represented by $+1$ during the inscription, by $+½$ during maintenance, by $-1$ during erasure, and by 0 during short-circuiting. An "X" in any column signifies an indifference, i.e. that several possibilities exist. The five right hand columns show the required positions of each switch.

Table IV

| Energization of a Display Cell According to FIG. 12 | | | | | | |
|---|---|---|---|---|---|---|
| Symbol | Function | $U_1-U_C$ | $T_A$ | $T_B$ | $T_M$ | $T_I$ | $T_E$ |
| M | Maintenance | ½ | 0 | 0 | 1 | 1 | 0 |
| SC | Short-Circuit | 0 | 0 | 1 | 0 | 0 | 1 |
| E | Erasure | $-1$ | 1 | 0 | 0 | 0 | 1 |
| I | Inscription | $+1$ | 0 | 1 | 0 | 1 | 0 |
| O | Open Circuit | X | X | X | X | 0 | 0 |

Figure 13:
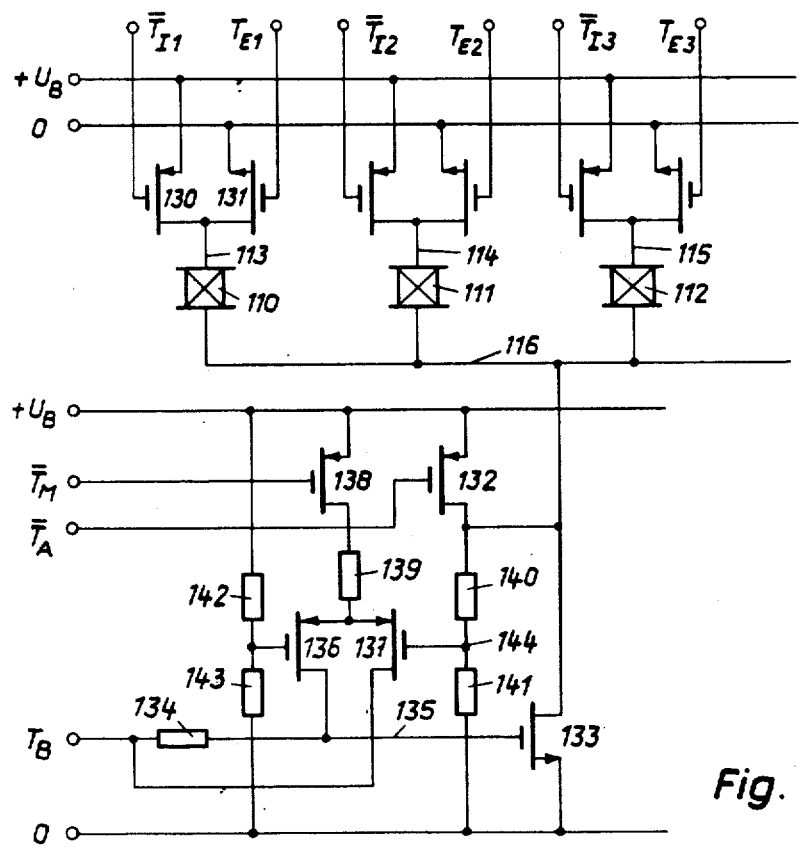
FIG. 13 is a circuit diagram of an energization circuit according to FIG. 12, including complementary MOS transistors.

FIG. 13 shows the energization circuit of the display cells, formed of MOST. As in FIG. 12, three cells 110, 111, 112 are shown. The separate electrode e.g. 113 of a cell e.g. 110 is connected to the drain of a p-channel MOST 130, controlled by the complement $\overline{T}_{I1}$ of the variable $T_{I1}$, whose source is at the voltage $+U_B$, and is also connected to the drain of an n-channel MOST 131 controlled by the variable $T_{E1}$ and whose source is connected to ground. Each of these transistors functions both as a switch and as a series resistor, e.g. transistor 130 acts as $R_I$ and $T_{I1}$ of FIG. 12. One pair of transistors controls the separate electrode of each cell. The control circuit for the common electrode 116 (lower part of the figure) combines logical and analog functions. The logical function is the control, by the variables $T_A$, and $T_B$ and $T_M$, of the conduction of transistors 132 and 138 having the same effect on the common electrode 116 as the three switches of FIG. 12. The analog function is that of a voltage regulator which supplies a voltage $U_B - U_M$ when a voltage $U_M$ is to be applied to the display cells. The p-channel MOST 132 functions as a simple switch; it is blocked when $\overline{T}_A = 1$ ($T_A = 0$) and conducts when $\overline{T}_A = 0$ ($T_A = 1$). In this conducting state, its resistance must be sufficiently low for the voltage drop across it to be negligeable even with the maximum current possible. The n-channel MOST 133 can have three different functions according to the state of the two control variables $T_B$ and $T_M$. When $\overline{T}_M = 1$ ($T_M = 0$) no current passes though the resistor 134, and the circuit operates as though the MOST 133 were directly controlled by the variable $T_B$. Consequently, MOST 133 is blocked when $T_B = 0$ and conducts when $T_B = 1$. The MOST 133 must fulfil the same requirement as MOST 132, namely that the voltage drop across it is negligeable even with the maximum current possible. Finally, when $T_B = 0$ and $\overline{T}_M = 0$ ($T_M = 1$), the MOST 133 acts in an intermediary range of conduction, as a series regulator. Its gate 135 is controlled by a regulating circuit formed of MOST 136, 137 and associated resistors, in a manner to maintain the voltage of the common electrode 116 at the desired value. The purpose of the MOST 138 is to control actuation of the regulation circuit by allowing passage of a current through the resistor 139. When $\overline{T}_M = 0$, this resistor 139 is as though it were in practice connected to the $+U_B$ terminal. The purpose of the voltage divider formed of resistors 140 and 141 is to reduce the voltage of electrode 116 to a value located within the range of linear operation of the regulation circuit. The purpose of the voltage divider formed of resistors 142 and 143 is to set up a reference voltage equal to the nominal voltage at point 144, this voltage itself having a fixed ratio relative to the voltage of electrode 116.

Having now given the conditions that the control variables must fulfil, the part of units S of FIG. 5 which is not incorporated in FIGS. 12 or 13 can be described. These units S combine the control variable K with the state variables F and with the memorized state variable M in a manner to correctly energize the display. The control variables K, which take the value 1 while certain operations must be carried out, and take the value 0 while other operations take place, are defined in Table V.

Table V

| | Definition of the Control Variables |
|---|---|
| $K_1$ | Maintenance of the digits displaying the units and tens of minutes and control of the memories. |
| $K_2$ | Short-circuiting and inscription of all of the digits. |
| $K_3$ | Erasure of the digits displaying the units and tens of minutes. |
| $K_4$ | Inscription of the digits displaying the units and tens of minutes. |
| $K_5$ | Erasure of the digits displaying the hours. |
| $K_6$ | Inscription and maintenance of the digits displaying the hours. |
| $K_7$ | General control for chaning the hours. |

The variables F and M, which are individual for each segment, are combined with the variables K, which are common to the entire system in logical equations to give the transfer variables T which determine control of the display, i.e. of the switches in the upper part of FIG. 12 or the transistors in the upper part of FIG. 13. These logical equations are of two types.

When there is simultaneously a state variable F and a memorized variable M, the equations of the corresponding transfer variables T are Inscription:

$$T_{Im} = F_m (K_1 + \overline{M}_m K_4)$$

Erasure:

$$T_{Em} = \overline{F_m + K_2(\overline{M}_m + K_3)} \qquad (3)$$

These equations represent an implementation by logical means of the change detector, combined with the control means, determining the instant and the duration of the cycles for inscription ($K_4$ and $K_2$) and erasure ($K_3$) as well as the functions of maintenance ($K_1$) and short-circuiting ($K_2$). These equations apply to the functions controlling display of the units and 10's of minutes, in the diagram of FIG. 5 (units 72 and 73), and represent the manner of energizing an electrochromatic display with a minimum current consumption.

When no memorized variables are available, the operations of erasure and inscription can take place in a correct manner if the following conditions are fulfilled:

1. Control of the maintenance and short-circuiting cycles on the basis of the state variables F combined with auxiliary control variables $K_6$ and $K_2$.

2. Control of an erasure operation on the basis of the state variables F combined with a control variable $K_5$ applied just before a possible change of F. In this manner, only the dark segments receive an erasure current.

3. Control of an inscription operation on the basis of the state variables F combined with a control variable $K_6$, which can be the same as that which controls the maintenance operation.

In effect, the diference of the voltage applied to a segment for an inscription operation and for a maintenance operation may be provided either by acting on the individual electrode of each segment, or by acting on the common electrode. The second possibility, which permits simplification of the logical operations required for control of the individual electrodes, has been chosen.

These operations are thus expressed by the following equations:

$$T_{Ih} = F_h K_8$$

$$T_{Eh} = \overline{F}_h K_2 + F_h K_3 \qquad (4)$$

These equations apply to the functions controlling the hours display in the diagram of FIG. 5 (unit 78). They represent an embodiment of a mode of energization with complete erasure (of the hours in this example) upon each change.

Energization of the common electrode requires the definition of three transfer variables $T_A$, $T_B$ and $T_M$ (see Table IV, as well as FIGS. 12 and 13). These variables must be synchronized with the control variables K appearing in equations (3) and (4), and are defined as follows:

$$T_A = K_3 + K_5$$

$$T_B = K_2$$

$$T_M = K_1 \qquad (5)$$

The sequence of the inscription, maintenance and erasure phases remains to be specified. These phases must obey a one-minute cycle for display of the units and tens of minutes, and a one-hour cycle for display of the hours. Variables $K_1$, $K_2$, $K_3$ and $K_4$ have a one-minute cycle having, with the sole exception of $K_2$, different phases where the variables alternatively take the values 0 and 1. Variables $K_5$, $K_6$ and $K_7$ have a one-hour cycle. Variable $K_7$ has the value 1 at the moment of a change of hour, or more precisely between the middle of the 59th minute and the middle of the 60th minute. Variables $K_5$ and $K_6$ are synchronized with the variables $K_1$ through $K_4$ and, moreover, only intervene when $K_7$ has the value 1. The mentioned exception concerning $K_2$ is that one of the short-circuiting phases is eliminated at the end of the 59th minute to allow an erasure operation. Table VI gives a sequence of control variables which has been experimentally tested on an electrochromic display. The last two lines of this Table give the phase durations and the instants corresponding to passage from one phase to the next.

Table VI

Sequence of the Control Variables During Any Minute(the modified sequences at the end of the 59th minute and beginning of the 60th minute are shown in parenthesis).

| Phase N° | | | 1 | 2 | 3 | 4 | 5 | 6 | 7 | 8 |
|---|---|---|---|---|---|---|---|---|---|---|
| Operation on units and tens of minutes symbols | | | SC | E | I+SC | SC | M | SC | M | SC (O) |
| Control variables (Units and Tens of Minutes) | M | $K_1$ | 0 | 0 | 0 | 0 | 1 | 0 | 1 | 0 |
| | CC | $K_2$ | 1 | 0 | 1 | 1 | 0 | 1 | 0 | 1(0) |
| | E | $K_3$ | 0 | 1 | 0 | 0 | 0 | 0 | 0 | 0 |
| | I | $K_4$ | 0 | 0 | 1 | 0 | 0 | 0 | 0 | 0 |
| Operation on the hours symbols | | | SC | O | SC (I) | SC | M | SC | M | SC (E) |
| Control Variables (Hours) | E | $K_5$ | 0 | 0 | 0 | 0 | 0 | 0 | 0 | 0(1) |
| | I | $K_6$ | 0 | 0 | 0(1) | 0 | 1 | 0 | 1 | 0 |
| General Hours Control | any minute | $K_7$ | | 0 | | | | | 0 | |
| | (59th minute) | $K_7$ | | 0 | | | | | (1) | |
| | (60th minute) | $K_7$ | | (1) | | | | | 0 | |
| Phase duration (seconds) | | | 2 | 8 | 2 | 4 | 8 | 16 | 8 | 12 |
| Time scale (seconds) | | | 0 | 2 | 10 | 12 | 16 | 24 | 40 48 | 60 |
| | | | 0 | | | | | 32 | | 60 |

The choice of phases was dictated by the following considerations:

Phase 1: each minute begins by a short-circuit (SC) applied to all of the segments which must remain or become clear. This short-circuit triggers the erasure of cells which must change from dark to clear, and reduces the charge that the battery has to supply for erasure.

Phase 2: erasure of the minutes segments must take place after change of the state variables, since the control logic requires both the ole variable (M) and the new variables (F), according to the control equations (4).

Phase 3: the inscription of the minutes and hours segments must take place simultaneously, after the changes of the state variables. The inscription of new segments is effected after erasure of the old segments, so that the transitory symbols appearing do not correspond to numbers diferent from the old and the new numbers of the display. For example, on FIG. 6 it can be seen that the passage from 3 to 4 gives a symbol without signification when the old (redundant) segments are erased first, but would give a 9 if the new segment were inscribed first.

Phases 4 and 6: short-circuit of the clear segments terminating the erasure operation and ensuring maintenance in this state.

Phases 5 and 7: maintenance of the dark segments by application of the maintenance voltage for approximately equal intervals. This maintenance operation is necessary if the dark state is associated with an internal leakage current in the display cells which produces a very slow erasure. If this leakage current is negligeable, i.e. if the dark state maintains itself for a time longer than the duration of the inscription cycle, the maintenance operation is not necessary, and the corresponding cells can be left in open circuit.

Phase 8: generally short circuit, except at the end of the 59th minute where, before a change of the hours, all of the dark segments of the hours symbol are erased.

Figure 14:
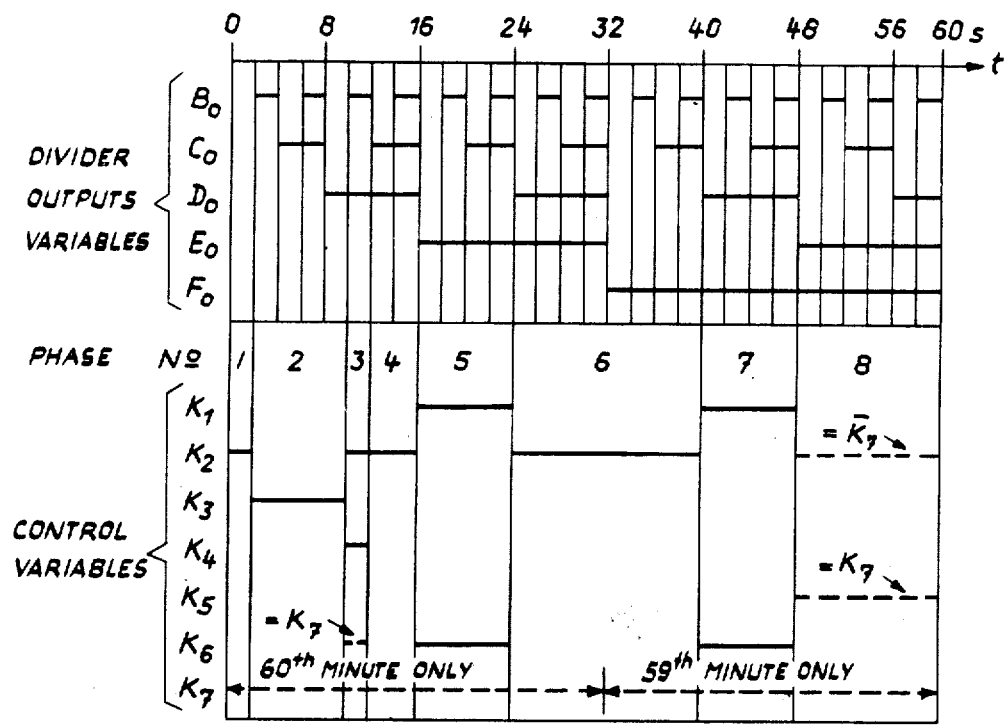
FIG. 14 is a diagram showing the program during one minute of the divider output variables and the display control variables.

FIG. 14 shows the variation as a function of time, during one minute, of the divider output variables $B_o$, $C_o$, $D_o$, $E_o$, $F_o$ and of the control variables $K_1$ to $K_7$. A logical combination of the output variables of the divider enables each of the control variables to be obtained. This logical combination depends on the selected duration of each phase. These periods have been chosen taking into account on the one hand the requirements of the display and on the other hand by choosing simple combinations of the output variables of the divider whenever the durations are of secondary importance (maintenance and short-circuiting phases). The logical combinations corresponding to FIG. 14 are as follows:

$K_1 = \bar{D}_o E_o \bar{F}_o + D_o \bar{E}_o F_o$
$K_2 = \bar{K}_1 \bar{K}_3 \bar{K}_5$
$K_3 = \bar{E}_o \bar{F}_o [\bar{D}_o (B_o + C_o) + \bar{B}_o \bar{C}_o D_o]$
$K_4 = B_o \bar{C}_o D_o \bar{E}_o \bar{F}_o$
$K_5 = K_7 E_o F_o$
$K_6 = K_1 + K_4 K_7$
$K_7 = \bar{B}_1 \bar{C}_1 \bar{B}_2 (\bar{F}_o \bar{A}_1 \bar{D}_1 \bar{A}_2 \bar{C}_2 + F_o A_1 D_1 A_2 D_2)$ The variables $K_1$, $K_3$ and $K_4$ are determined by the divider output variables shown in the upper part of FIG. 14. Variable $K_7$ is determined by the divider output variables having a longer period (up to one hour), and which are defined in FIG. 7. Variables $K_2$, $K_5$ and $K_6$ are logical combinations of the preceding variables.

In the preceding description, no mention has been made of the combinatory logical circuits satisfying the set of equations (1) through (6). Methods enabling passage from logical equations to a logical diagram including AND, OR, and NOR gates, and so on, are known. Methods of carrying out logical functions by means of complementary MOS intransistors are also known.

Therefore, the logic circuitry for several of the elements shown in block form in FIG. 5 will now be described.

Figure 15:
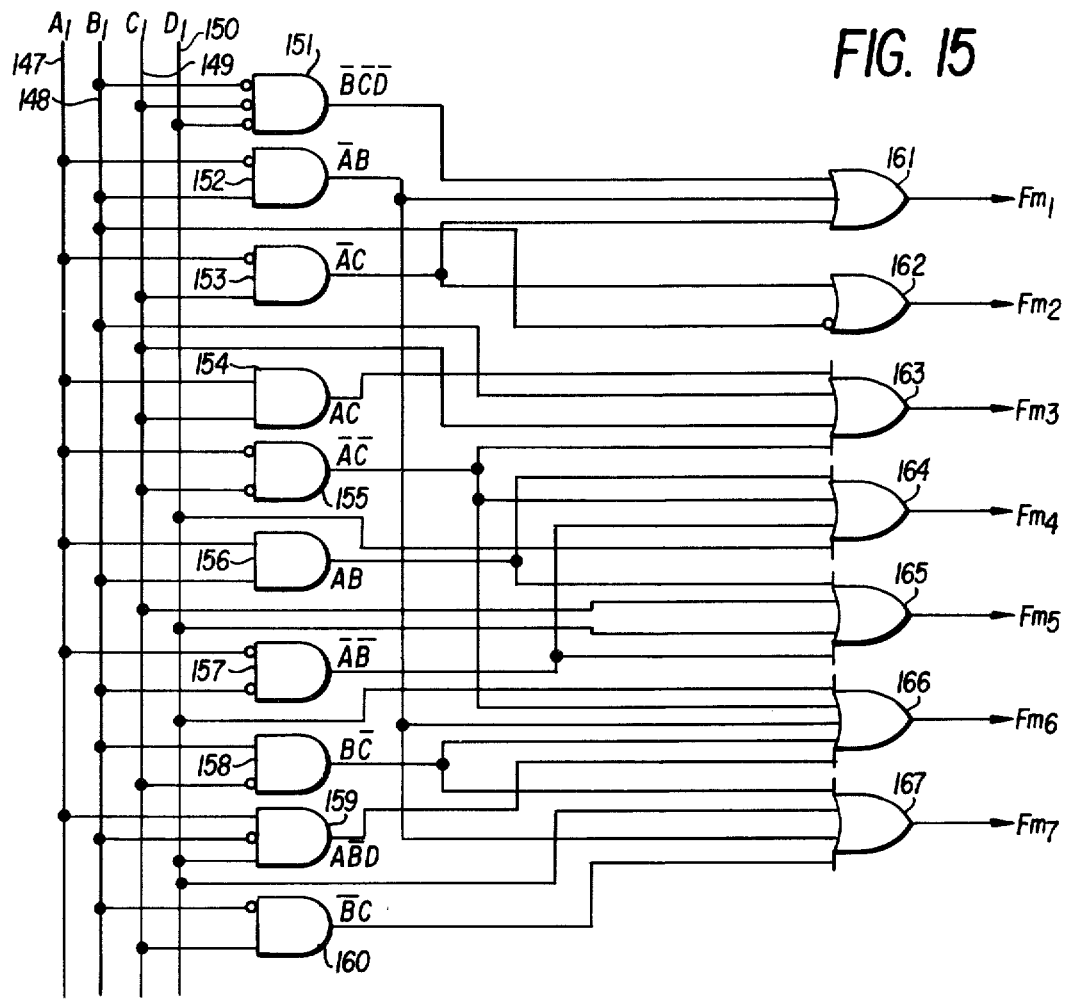
FIGS. 15–21 are diagrams showing logic circuitry for several of the components of the present invention.

As described previously, code converter unit 62 is provided with 4 inputs connected to the outputs A B C D of the divider block 54 which has a cycle of 10 minutes. These outputs are labelled $A_1 B_1 C_1 D_1$ in FIG. 7. This unit 62 has 7 outputs $F_{m1}$ through $F_{m7}$, as shown in FIG. 15, delivering the state variables corresponding to the display in the minutes. The formation of these variables is to be found in Table III, second column where the logical relations are given.

According to the standard rules of logic, a logical diagram of code converter 62, comprising AND-gates and OR-gates can be deduced from the logical relations. Such a diagram is shown in FIG. 15. The four divider outputs $A_1 B_1 C_1$ and $D_1$ are coupled to 4 verticle lines 147–150 shown at the left of this figure. A row of 10 AND gates 151 through 160 is first used to form the minutes terms in the expression of Table III; 8 of the gates 152, 153, 154, 155, 156, 157, 158, 160 have two inputs, two of them, 151 and 159, have three inputs (for the minutes terms $\bar{B} \bar{C} \bar{D}$ and $A \bar{B} C$). Small circles at the inputs, as for gate 151 for example, indicate that the complement of the corresponding variable has to be taken. This complement is available at every divider stage, or it can be obtained by inverters inserted between the lines $A_1 B_1 C_1 D_1$ and the gates.

The outputs of these AND-gates are connected to the inputs of 7 OR-gates 161 through 167, among which gate 162 has 2 inputs, gate 161 has 3 inputs, gates 163, 164, 165, 167 have 4 inputs each, and gate 166 has 5 inputs. Each OR-gate delivers one of the state variables $F_{m1}$ through $F_{m7}$. The number of inputs corresponds to the number of minutes in the relations of Table III, second column. None of the OR-gate inputs is inverted with the only exception of gate 162, the input of which can be connected to the complement $\bar{B}_1$ of $B_1$.

Figure 16:
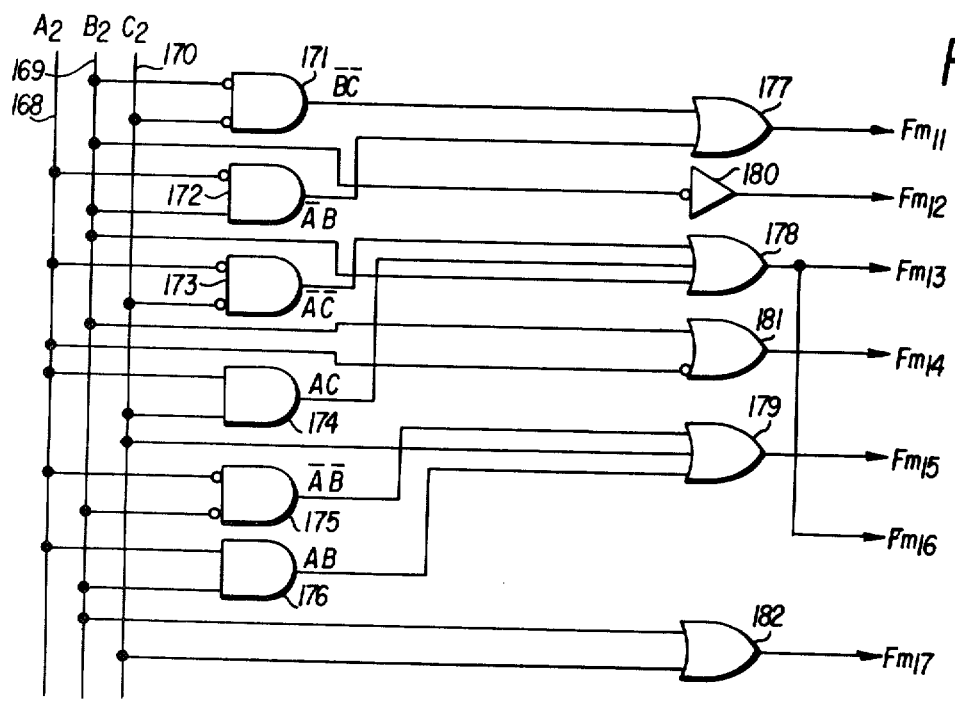

In an analogous way, code converter unit 63 has 3 inputs connected to divider outputs $A_2 B_2 C_2$ of FIG. 7 and has 7 outputs $F_{m11}$ through $F_{m17}$, as shown in FIG. 16, delivering the state variables corresponding to the display of the tenths of minutes. The logical relations necessary to form these variables are in the third column of Table III. The three divider outputs $A_2$, $B_2$, $C_2$ are coupled to three lines 168–170. A row of 6 AND gates 171–176 receiving these outputs is first used in which all of them have two inputs. The outputs of these AND gates are connected to the inputs of three OR gates 177–179; and gate 177 has two inputs and gates 178, 179 have three inputs. Outputs $A_2$, $B_2$, $C_2$ are also connected to inverter 180, and OR gates 181, 182, in which the inverter has one input and gates 181, 182 have two inputs. The inputs to all these gates which are inverted are shown by the small circles.

Figure 17:
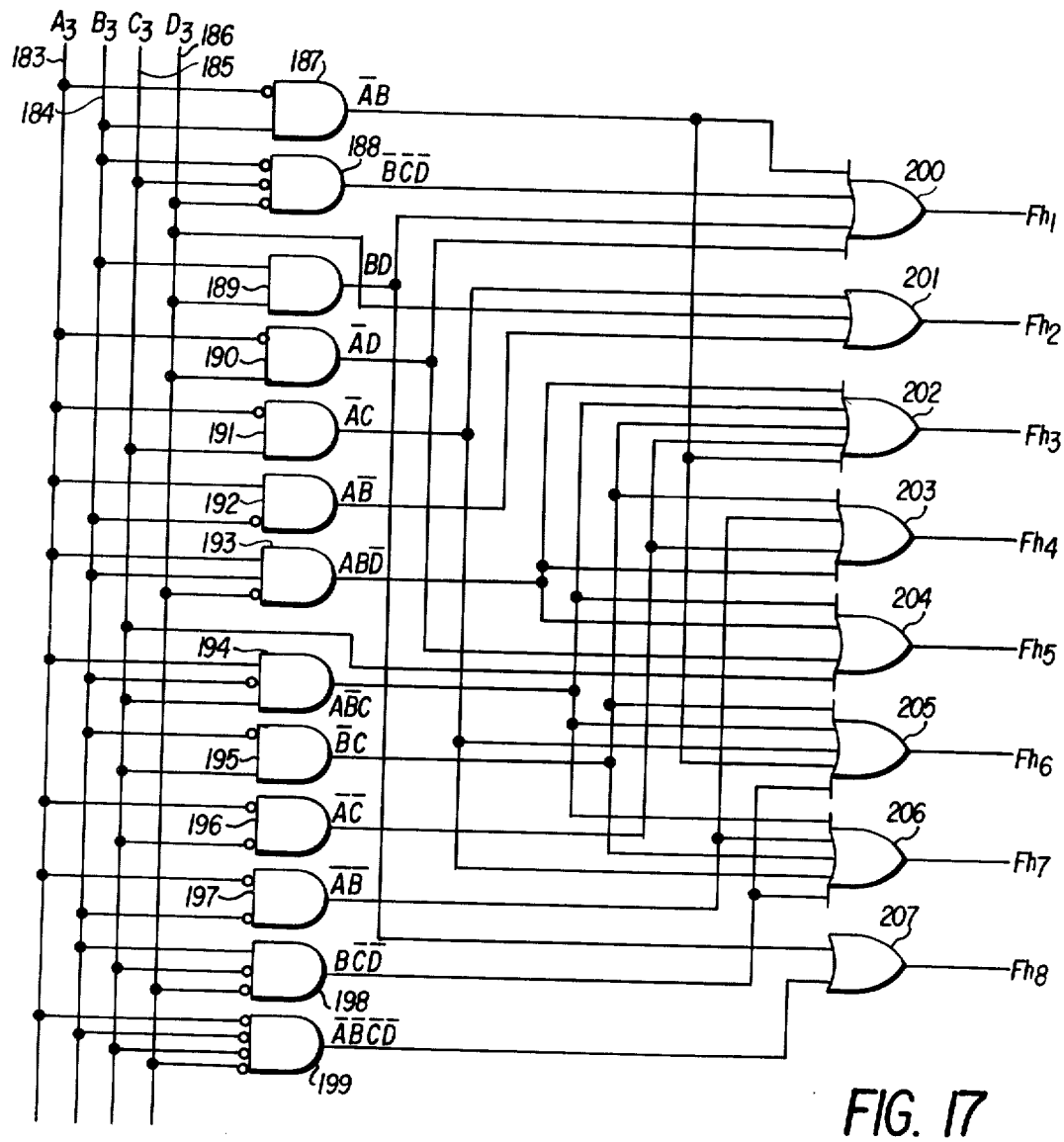

Also in an analogous way, code converter unit 64 has 4 inputs connected to divider outputs $A_3 B_3 C_3 D_3$ of FIG. 7 and has 8 outputs $F_{h1}$ through $F_{h8} = F_{h9}$ delivering the state variables corresponding to the display of the hours as shown in FIG. 17. The logical relations necessary to form these variables are in the fourth column of Table III. The four divider outputs $A_3$, $B_3$, $C_3$ and $D_3$ are coupled to four lines 183–186. A row of 13 AND gates 187–199 receiving these outputs is first used in which 8 gates 187, 189–192, 195–197 have two inputs, 4 gates 188, 193–194, 198 have three inputs and 1 gate 199 has four inputs. The outputs of these AND gates are connected to 8 OR gates 200–207, among which gate 207 has two inputs, gate 201 has three inputs, gates 200, 203, 204 have four inputs, and gates 202, 205, 206 have five inputs. Again the small circles represent the complement of the data.

Each of the memory blocks 68 and 69 comprises seven memory cells of the type illustrated as a logic circuit in FIG. 10 and as a detailed C-MOS circuit in FIG. 11. Every cell has one input F connected to one of the state variables $F_{m1}$ through $F_{m7}$ for block 68 and $F_{m11}$ through $F_{m17}$ for block 69. A control variable $K_1$ (88 in FIG. 5) common to all memory cells, is received from block 86 to be described below. The memory cells deliver output variables M and $\overline{M}$ which may be labelled according to their corresponding input variables $M_{m1}$ through $M_{m7}$ and $M_{m11}$ through $M_{m17}$.

Blocks 70, 71 combine the functions of selectors, change detectors and display drivers for the minutes and the tenths of minutes. Each of blocks 70, 71 comprises seven logic units and seven energization circuits. Each of the logic units, as already described, implements the functional relations (3). Each unit has two signal inputs, one being connected to a code converter output $F_{m1}$ through $F_{m7}$ for unit 70 and $F_{m11}$ through $F_{m17}$ for unit 71, and the other to a corresponding memory output $\overline{M}_{m1}$ through $\overline{M}_{m7}$ for unit 70 and $\overline{M}_{m11}$ through $\overline{M}_{m17}$ for unit 71. Each unit 70, 71 has also four control inputs $K_1$ $K_2$ $K_3$ $K_4$ connected to outputs of VC block 86. Each unit 70, 71 has two outputs delivering transfer variables $T_{Im1}$, $T_{Em1}$ through $T_{Im7}$, $T_{Em7}$ for block 70 and $T_{Im11}$, $T_{Em11}$ through $T_{Im17}$, $T_{Em17}$ for block 71.

Figure 18:
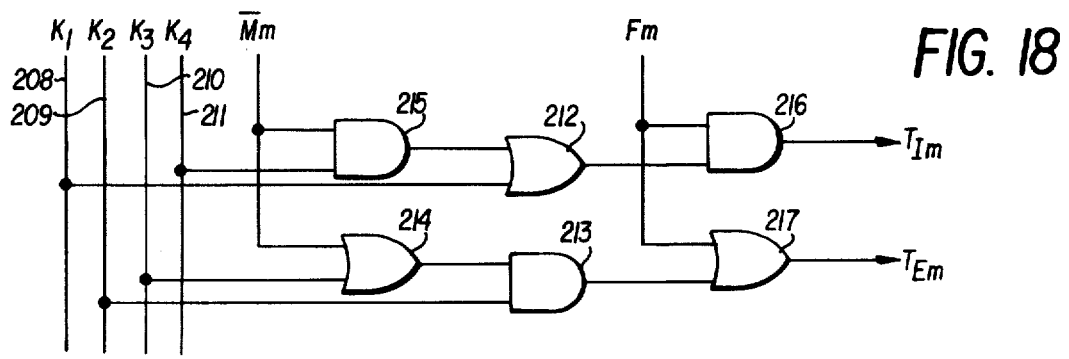

FIG. 18 is a logical diagram of one of the units, obtained from the equation (3). The four control inputs $K_1$-$K_4$ are coupled to 4 lines 208 - 211 which are connected, respectively, to OR gate 212, AND gate 213, OR gate 214 and AND gate 215. Memory output $\overline{M}_m$ is connected as the other inputs to gates 214, 215 and the outputs of these gates are coupled to the other inputs of gates 212, 213. An AND gate 216 has one input connected to the output of gate 212 and its other input coupled to output $F_{m1}$ while an OR gate 217 has one input connected to the output of gate 213 and its other input connected to output $F_m$. Gate 216 provides transfer variable $T_{Im}$ and gate 217 provides transfer variable $T_{Em}$.

Each logic unit of blocks 70 and 71 has their outputs $T_{Im}$ and $T_{Em}$ connected to corresponding inputs of a display driver circuit or energization circuit represented by the circuit diagram of FIG. 13. Three display cells 110, 111, 112 are represented in FIG. 13 with their corresponding individual energization circuits like 130 and 131; it is evident that seven cells are needed for displaying the minutes and seven cells are needed for displaying the tenths of minutes.

Block 78 combines the functions of selector, change detector and display driver for the hours. It comprises eight logic units and eight energization circuits. Each of the logic circuits, as already described, implements the functional relations (4). Each unit has one signal input connected to the corresponding code converter output $F_{h1}$ through $F_{h8}$ and three control inputs $K_2$ $K_5$ $K_6$ connected to the outputs of VC block 86. Each unit has two outputs delivering transfer variables $T_{Ih1}$, $T_{Eh1}$ through $T_{Ih8}$, $T_{Eh8}$.

Figure 19:
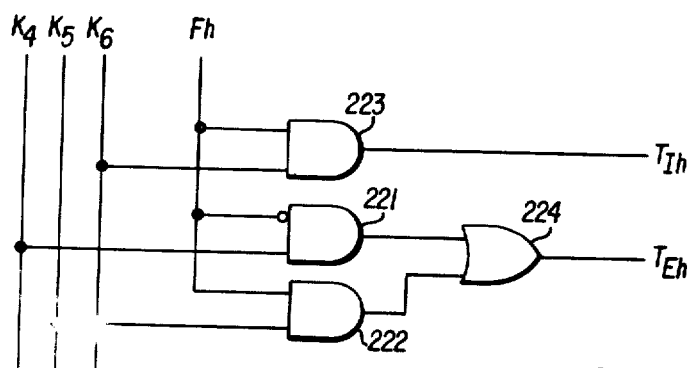

FIG. 19 is a logical diagram of one of these units obtained from the equation (4). The three control inputs $K_2$, $K_5$, $K_6$ are coupled to 3 lines 218 - 220 which are connected, respectively to AND gates 221, 222, 223. The other inputs to gates 222, 223 is the output $F_H$ and the other input to gate 221 is the complement of output $F_H$. An OR gate 224 has two inputs connected to the outputs of gates 221, 222 and provides at its output control variable $T_{Eh}$ while the output of gate 223 is variable $T_{Ih}$.

Each logic unit of block 78 has its outputs $T_{Ih}$, $T_{Eh}$ connected to corresponding inputs of energization circuits similar to the three units shown in FIG. 13.

The common control circuit 81 has 4 inputs connected to the outputs $K_1$, $K_2$, $K_3$, $K_5$ of VC block 87. It comprises a logic block and part of the energization circuit. The logic block is defined by the equation (5). Two of three output variables are needed in complementary form; they are the common electrode transfer variables $T_M$, $T_A$. Variable $T_B$ is not in complementary form.

Figure 20:
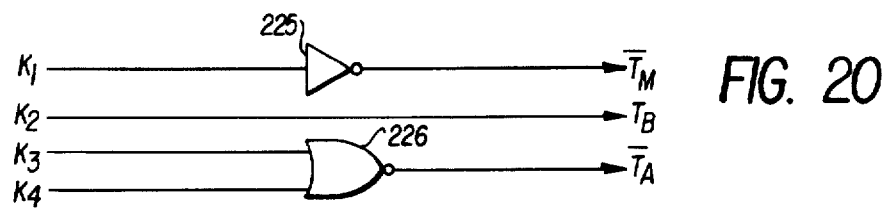

FIG. 20 shows the logic diagram of this logic block. Output $K_1$ is coupled as the input to an inverter 225 whose output is variable $\overline{T}_M$. $K_2$ is the variable $T_B$. Outputs $K_3$, $K_5$ are coupled as inputs to NOR gate 226 whose output is variable $\overline{T}_A$.

The output of this logic block of FIG. 20 drives the part of the energization circuit which drives the common electrode. It is shown as the lower part of FIG. 12, below line 116.

Control variables unit (VC) 86 has 13 inputs connected to the outputs $B_0$, $C_0$, $D_0$, $E_0$, $F_0$, $A_1$, $B_1$, $C_1$, $D_1$, $A_2$, $B_2$, $C_2$, $D_2$ of the dividers 52, 54, 56 (FIG. 7) This unit 86 has 7 outputs delivering control variables $K_1$-$K_7$ which control blocks 68, 69, 72, 73, 78 and 81, and synchronize their functions.

Figure 21:
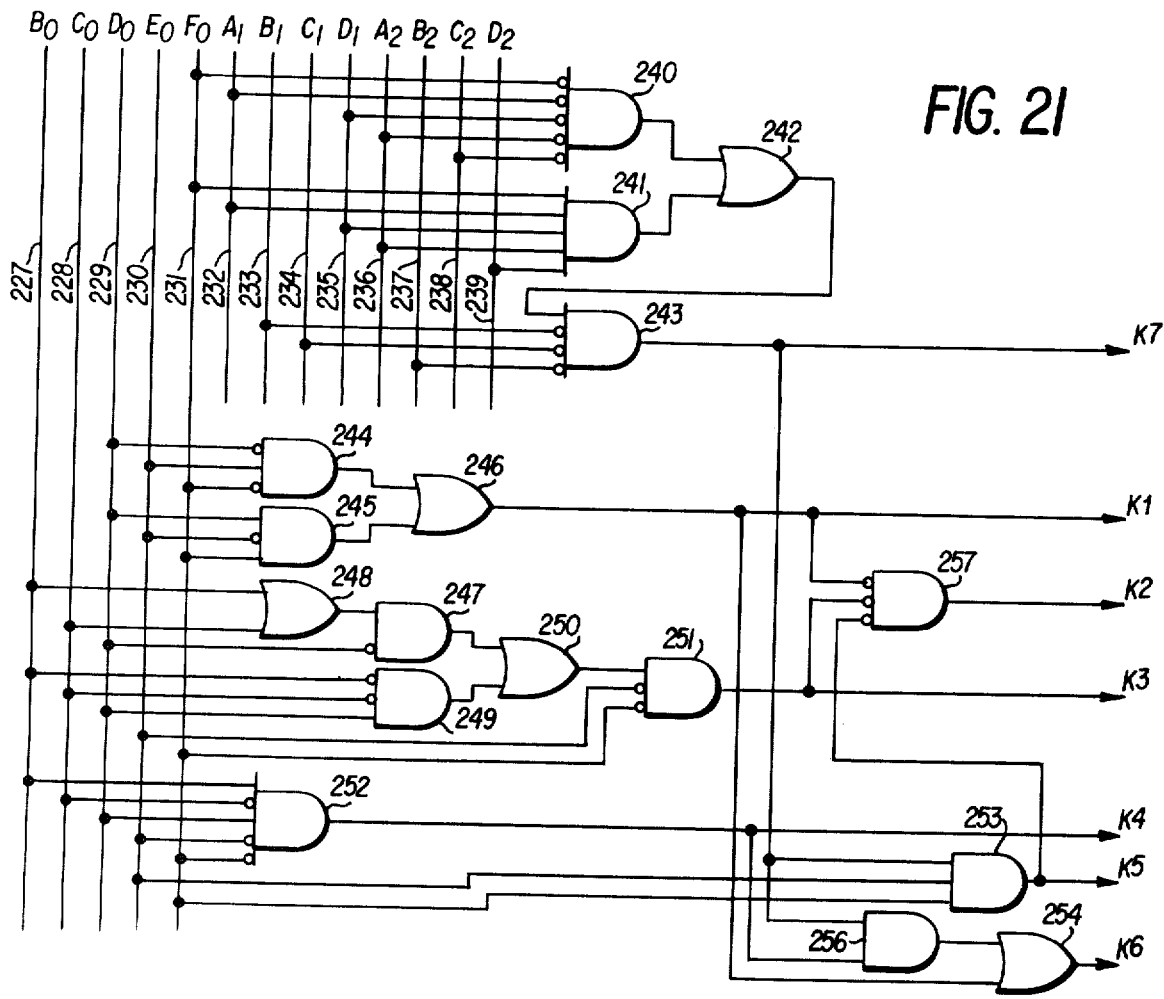

As shown in FIG. 21 the 13 inputs are provided on 13 lines 227–239, respectively. An AND gate 240 has 5 inputs receiving the complements of $F_0$, $A_1$, $D_1$, $A_2$, $C_2$, while an AND gate 241 has 5 inputs receiving outputs $F_0$, $A_1$, $D_1$, $A_2$, $D_2$. An OR gate 242 has two inputs connected to the outputs of gates 240, 241 and has its output coupled as one input to an AND gate 243. This latter gate has 3 other inputs receiving the complement of outputs $B_1$, $C_1$, $B_2$, and its output is control variable $K_7$.

An AND gate 244 receives as its 3 inputs the complement of outputs $D_0$, $F_0$ and the output $E_0$. An AND gate 245 has its 3 inputs connected to the outputs $D_0$, $F_0$ and the complement of output $E_0$. The outputs of gates 244, 245 are fed as two inputs to an OR gate 246 whose output is control variable $K_1$.

An AND gate 247 has one input connected to the output of an OR gate 248 having two inputs receiving outputs $B_0$, $C_0$. The other input of gate 247 is the complement of output $D_0$. An AND gate 249 has 3 inputs, two of which receive the complement of outputs $B_0$, $C_0$ and the third of which receives output $D_0$. An OR gate 250 has its 2 inputs connected to the outputs of gates 247, 249 and provides its output as one input to AND gate 251. The other two inputs of gate 251 are the complements of outputs $E_0$, $F_0$, and the output of gate 251 is variable $K_3$.

An AND gate 252 has 5 inputs, two of which are coupled to outputs $B_0$, $D_0$, and three of which receive outputs $C_0$, $E_0$, $F_0$. The output of gate 252 is variable $K_4$.

An AND gate 253 has 3 inputs connected to the output of gate 243 ($K_7$) and outputs $E_0$, $F_0$. The output of gate 253 is variable $K_5$.

An OR gate 254 has one input connected to the output of an AND gate 256 having two inputs receiving the outputs of gate 243 ($K_7$) and gate 252 ($K_4$), and the other input connected to the output of gate 246 ($K_1$). The output of gate 254 is variable $K_6$.

The variable $K_2$ is provided by an AND gate 257 having 3 inputs receiving the complements of $K_1$ (from gate 246), $K_3$ (from gate 251) and $K_5$ (from gate 253).

What is claimed is:

1. In a device for providing an electro-optical display of time comprising an electronic timekeeper fed by a voltage source and including a time base and a frequency divider connected to said base, and an electro-optical display formed of cells containing electrochromic materials able to take two different visual aspects, the cells controlled by a code converter connected to said divider and having outputs supplying state variables each defining the aspect that a display cell must have, one of the aspects of a cell corresponding to a stable state, the other aspect of a cell corresponding to a quasi-stable state which requires at most a very low power to be maintained, and transition of a cell from one state to the other requiring precisely determined amounts of energy, the improvement comprising a change detector means including a memory means connected at its inputs to the outputs of said code converter and a selector means connected at its inputs to the outputs of said memory means and said code converter, and means, connected at its inputs to said divider and at its outputs to said memory means and said selector means, for providing control variables to determine phases of writing and reading the memory means and to activate in the selector means operations of inscriptions and erasures, said selector means generating control signals at its outputs for dispensing the required amounts of energy to each display cell to ensure correspondence between the visual aspect of each cell and the state variables delivered by the code converter in a manner to minimize the mean power consumption.

2. Device according to claim 1, wherein said means for providing generates additional control variables and in which each cell comprises electrodes, one of said electrodes being a separate electrode for each cell and the other of said electrodes being common to a group of cells; said common electrode is at a variable potential controlled by the additional control variables; said voltage source is a single voltage source; and each said cell has its individual electrodes connected to said voltage source through a plurality of switches wherein the type of energization of each cell is determined by the connection of said individual and common electrodes to said voltage source through a particular switch, said switches being controlled by said control signals.

3. Device according to claim 1 wherein a group of control variables applied to said selector means correspond to a group of cells so that the period of the phase of the control variables coincides with the period determined by the changes of aspect of this group.

4. Device according to claim 3, in which said selector means delivers to each cell a current pulse in one direction to make it pass from one state designated as the clear state to another state designated as the dark state and a pulse in the opposite direction to make it return from the dark state to the clear state, and wherein said providing means provides one control variable to said selector means causing the erasure of all dark cells of one group of cells slightly before a change of state variables, and another control variable to said selector means causing inscription of new dark cells of said one group slightly after said change.

5. Device according to claim 3, in which said providing means provides one control variable to said selector means which causes the transition of all clear cells of one group of cells to become dark slightly before a change of the state variables if the converter and another control variable provided by said providing means to said selector means causes transition of new clear cells of said one group to become clear slightly after said change.

6. Device according to claim 1, in which the selector means, which provides energization pulses to each display cell, includes means for combining said state variables with control variables which determine the duration and the phase sequence of inscription and erasure of the display cells.

7. Device according to claim 3, in which the change detector means is a logical circuit which processes an actual value (F) of each state variable with a memorized variable (M) representing the value of (F) at a given prior instant, said value (M) being delivered by the memory means which had memorized the value of the state variable (F) at said prior instant.

8. Device according to claim 7, in which the logical functions of said change detector means including said selector means are carried out simultaneously by means combining said control variables (K) with said state variables (F) and with memorized variables (M).

9. Device according to claim 4, in which at least one first display group which relatively frequently changes aspect is energized by said change detector means in a manner such that only changes of state variables of said first group cause changes of the corresponding individual cells of said first group, and at least one second display group which less frequently changes aspect is energized by another code converter and selector means in a manner such that upon each change of at least one of the state variables of said second group all of the cells of said second group pass by an identical intermediary state.

10. Device according to claim 1, in which said code converter is formed of combinatory logical circuits directly delivering said state variables at their output.

11. Device according to claim 2, in which said separate electrode of each cell and said common electrode are each associated with a first transistor capable of connecting it to one of the terminals of the voltage source and a second transistor capable of connecting it to the other terminal of said voltage source, said first and said second transistors comprising said switches.

12. Device according to claim 1, in which said selector means ensures maintenance of the dark state of a cell during a relatively long interval of time by the intermittent application of a voltage slightly greater that the voltage existing across said cell in its dark state.

13. Device according to claim 8, in which four control variables are associated with at least one group of display cells, each variable having the value "1" during a certain operation and "0" during the other operations, said control variables being associated with the operations as follows:

$K_1$ = maintenance of the dark state; $K_2$ = short-circuiting;

$K_3$ = erasure; and $K_4$ = inscription, said control variables being logically combined with said state variables F and memorized variables M by said selector means to deliver a first transfer variable $T_I$ of value 1 when one transistor associated with a separate electrode for each cell connects it to the positive terminal of said voltage source, and a second transfer variable $T_E$ of value 1 when another transistor associated with the separate electrode connects it to the negative terminal of said voltage source, said logical combinations satisfying the following equations:

$$T_I = F(K_1 + \overline{M} K_4)$$
$$\overline{T_E} = F + K_2(\overline{M} + K_3)$$

14. Device according to claim 4, in which three control variables (K) are associated with at least one group of display cells, each control variable having the value "1" during at least one certain operation and "0" during the other operations, these control variables being associated with the operation as follows:

$K_2$ = short-circuit and inscription; $K_5$ = erasure; and $K_6$ = inscription and maintenance, said control variables being logically combined with state variables from another code converter by another selector means to deliver a first transfer variable $T_I$ of value 1 when one transistor associated with a separate electrode for each cell connects it to the positive terminal of said voltage source, and a second transfer variable $T_E$ of value 1 when another transistor associated with the separate electrode connects it to the negative terminal of said voltage source, said logical combinations satisfying the following equations:

$T_I = F K_6$ $T_E = FK_2 + FK_5$

15. Device according to claim 9, in which all of said cells are connected to a single common electrode, the control of which is associated with three transfer variables $T_A$, $T_B$ and $T_M$ so that when $T_A = 1$ said common electrode is connected to the positive terminal of said voltage source, when $T_B = 1$ it is connected to the negative terminal of said voltage source, and when $T_M = 1$ it is at an intermediary maintenance voltage, said transfer variables being related to control variables K by the following relations:

$T_A = K_3 + K_5$ $T_B = K_2$ $T_M = K_1$ wherein $K_1$ = maintenance of the dark state; $K_2$ = short-circuiting and inscription; and $K_3$ and $K_5$ = erasure.

* * * * *